(12) United States Patent
Kim et al.

(10) Patent No.: US 10,477,690 B2
(45) Date of Patent: Nov. 12, 2019

(54) FLEXIBLE CIRCUIT BOARD

(71) Applicant: GIGALANE CO., LTD., Hwaseong-si, Gyeonggi-do (KR)

(72) Inventors: Ik Soo Kim, Hwaseong-si (KR); Byung Yeol Kim, Hwaseong-si (KR); Sang Pil Kim, Hwaseong-si (KR); Da Yeon Lee, Hwaseong-si (KR); Hwang Sub Koo, Hwaseong-si (KR); Hyun Je Kim, Hwaseong-si (KR); Hee Seok Jung, Hwaseong-si (KR)

(73) Assignee: GIGALANE CO., LTD., Hwaseong-si, Gyeonggi-Do (KR)

( * ) Notice: Subject to any disclaimer, the term of this patent is extended or adjusted under 35 U.S.C. 154(b) by 0 days.

(21) Appl. No.: 16/075,198

(22) PCT Filed: Feb. 8, 2017

(86) PCT No.: PCT/KR2017/001374
§ 371 (c)(1),
(2) Date: Aug. 3, 2018

(87) PCT Pub. No.: WO2017/138745
PCT Pub. Date: Aug. 17, 2017

(65) Prior Publication Data
US 2019/0053379 A1 Feb. 14, 2019

(30) Foreign Application Priority Data
Feb. 11, 2016 (KR) .......................... 10-2016-0015777

(51) Int. Cl.
*H05K 1/18* (2006.01)
*H01P 3/08* (2006.01)
*H05K 1/02* (2006.01)

(52) U.S. Cl.
CPC ............... *H05K 1/189* (2013.01); *H01P 3/08* (2013.01); *H01P 3/082* (2013.01); *H05K 1/025* (2013.01);
(Continued)

(58) Field of Classification Search
CPC ........ H05K 1/189; H05K 1/025; H05K 1/181; H05K 1/0243; H01P 3/08
See application file for complete search history.

(56) References Cited

U.S. PATENT DOCUMENTS 7,427,718 B2 * 9/2008 Ng ...................... H05K 1/0224
174/255
7,478,472 B2 * 1/2009 Lauffer ................ H01L 23/552
174/36

(Continued)

FOREIGN PATENT DOCUMENTS

JP 2001144452 A 5/2001
JP 2006157646 A 6/2006

(Continued)

OTHER PUBLICATIONS

International Search Report and Written Opinion of PCT/KR2017/001374 dated Apr. 18, 2017, 11 pages.

*Primary Examiner* — Nathan Milakovich
(74) *Attorney, Agent, or Firm* — Brundidge & Stanger, P.C.

(57) ABSTRACT

A flexible circuit board is disclosed. The flexible circuit board of the present invention comprises: a substrate part; and a transmission part formed to extend from the substrate part, and having two or more lines, which are aligned in parallel in a thickness direction, for transmitting a high frequency.

20 Claims, 8 Drawing Sheets

(52) U.S. Cl.
CPC .......... *H05K 1/0221* (2013.01); *H05K 1/181* (2013.01); *H05K 1/0228* (2013.01); *H05K 1/0243* (2013.01); *H05K 1/0298* (2013.01)

(56) References Cited

U.S. PATENT DOCUMENTS

| | | | | |
|---|---|---|---|---|
| 8,013,254 B2* | 9/2011 | Lee | ................... | H05K 1/0224 |
| | | | | 174/254 |
| 8,502,082 B2* | 8/2013 | Chan | ................... | H05K 3/383 |
| | | | | 174/256 |
| 8,624,693 B2* | 1/2014 | Kato | ................... | H01P 1/20363 |
| | | | | 333/238 |
| 8,798,694 B2* | 8/2014 | Morishita | ............. | H01Q 1/243 |
| | | | | 455/575.3 |
| 8,975,527 B2* | 3/2015 | Takaoka | ................ | H05K 1/028 |
| | | | | 174/254 |
| 9,426,881 B2* | 8/2016 | Ishikawa | .............. | H04N 5/2253 |
| 9,596,749 B2* | 3/2017 | Chen | ................... | H05K 1/0216 |
| 10,356,895 B2* | 7/2019 | Kim | ................... | H05K 1/0281 |
| 2006/0019075 A1* | 1/2006 | Myoung | ............. | H05K 3/4691 |
| | | | | 428/209 |
| 2008/0099230 A1* | 5/2008 | Takahashi | ........... | H05K 3/4691 |
| | | | | 174/250 |
| 2011/0198111 A1* | 8/2011 | Naganuma | ........... | H05K 3/4691 |
| | | | | 174/254 |
| 2014/0376199 A1* | 12/2014 | Kato | ...................... | H01P 3/085 |
| | | | | 361/753 |
| 2015/0136447 A1* | 5/2015 | Katou | ................. | H05K 1/0218 |
| | | | | 174/251 |
| 2015/0327358 A1 | 11/2015 | Hidaka | | |
| 2017/0084974 A1* | 3/2017 | Baba | ...................... | H01P 3/088 |
| 2017/0084975 A1* | 3/2017 | Baba | ........................ | H01P 3/08 |
| 2017/0290184 A1* | 10/2017 | Kim | ......................... | H05K 1/11 |
| 2017/0358847 A1* | 12/2017 | Cho | ..................... | H01Q 1/243 |
| 2018/0206331 A1* | 7/2018 | Kim | ..................... | H05K 1/024 |
| 2018/0206332 A1* | 7/2018 | Kim | ................... | H05K 1/0225 |
| 2018/0206335 A1* | 7/2018 | Kim | ....................... | H05K 3/28 |
| 2018/0359845 A1* | 12/2018 | Park | ..................... | H05K 1/024 |
| 2019/0041907 A1* | 2/2019 | Kim | ..................... | G06F 1/1618 |
| 2019/0045630 A1* | 2/2019 | Kim | ....................... | H05K 1/118 |

FOREIGN PATENT DOCUMENTS

| | | | |
|---|---|---|---|
| JP | 2015065252 A | * | 4/2015 |
| KR | 20030097028 A | * | 12/2003 |
| KR | 1020030097028 A | | 12/2003 |
| KR | 1020040061050 A | | 7/2004 |

* cited by examiner (a)

(b)

(a)

(b)

(a)

(b)

(a)

(b)

(a)

(b)

(a)

(b)

(c)

(d)

FLEXIBLE CIRCUIT BOARD

CROSS-REFERENCE TO RELATED APPLICATIONS

This Application is the National Stage filing under 35 U.S.C. § 371 of PCT Application Ser. No. PCT/KR2017/001374 filed on Feb. 8, 2017, which claims the benefit of Korean Patent Application No. 10-2016-0015777 filed on Feb. 11, 2016. The disclosures of both applications are hereby incorporated herein by reference in their entireties.

TECHNICAL FIELD

The present disclosure relates to a flexible circuit board.

BACKGROUND ART

A radio frequency (RF) signal line is provided in a wireless terminal such as a mobile phone. The RF signal line according to the related art is mounted in the form of a coaxial cable. In the case of being mounted in the form of the coaxial cable, it is general that the flexible circuit board is used in recent years because the space utilization in the wireless terminal is deteriorated.

Since an optimum impedance of a signal transmitting terminal of the flexible circuit board is about 33Ω, and an optimum impedance of a signal receiving terminal is about 75Ω, a characteristic impedance of the flexible circuit board may be generally designed in consideration of all the signal transmitting/receiving terminals.

When an external signal is introduced into the flexible circuit board, the above-described characteristic impedance deviates from 50Ω that is a reference value to adversely affect signal transmission efficiency. When the other part that is a conductor such as a main board, a sub board, a battery, or the like come into contact with the ground or is disposed close to the ground, the characteristic impedance deviates from 50Ω while a signal is introduced from the outside.

Thus, the flexible circuit board may be mounted on a position that is approximately spaced apart from the other part, or a dielectric is adjusted in thickness so as to prevent the impedance from varying.

An RF transmission line that transmits the high frequency signal is applied to various wireless terminals such as a smart phone, a tablet, a wearable device, and the like. In recent years, as development of communication technologies, a carrier aggregation (CA) technology, which uses one bundle of two or more frequency bands different from each other, is applied to improve a data transmission speed.

For this, two or more RF transmission lines that transmit the high frequency signal is used in the wireless terminal. The two or more RF transmission lines and a normal transmission line for transmitting normal signals such as a plurality of digital signals and analog signals, power, and the like are connected to the main board and the sub board.

As described above, when the coaxial connector is used as each of the RF transmission line to prevent signals from interfering with each other, a space occupied by the thickness of the coaxial connector itself and a fixing body for fixing he coaxial connector increases in the wireless terminal. To solve such the spatial problem, there is a need to use the flexible circuit board.

However, when the flexible circuit board is used, since the RF transmission lines different from each other have to be spaced apart from each other so as to solve the signal interference problem, there is also a limitation in solving the spatial problem within the wireless terminal.

In addition, there is a problem that the number of connector connecting the RF transmission lines to each other increases, and the length of each of the RF transmission lines becomes longer, and thus, a signal loss also increases.

It should be understood that the foregoing description of the background art is merely for the purpose of promoting a better understanding of the background of the present invention, and is not to be construed as admission that the prior art is known to those skilled in the art.

DISCLOSURE OF THE INVENTION

Technical Problem

An object of the present invention is to provide a flexible circuit board in which two or more lines for transmitting RF signals are parallelly bundled in a thickness direction to reduce a space occupied by the RF transmission lines in a wireless terminal.

Technical Solution

To achieve this object, a flexible circuit board according to the present invention includes: a substrate part; and a transmission part which is formed to extend from the substrate part and on which two or more lines transmitting a high frequency are arranged in parallel in a thickness direction.

The transmission part may include: a shielding part formed to extend from the substrate part; a first radio frequency (RF) transmission part formed to extend from the substrate part and disposed to be spaced a predetermined from the shielding part in the thickness direction; and a second RF transmission part formed to extend from the substrate part and disposed to be spaced a predetermined distance from the shielding part in the thickness direction, wherein the second RF transmission part is disposed to correspond to the first RF transmission part with the shielding part therebetween.

The substrate part may further include a first coupling part coupling the shielding part to the first RF transmission part and a second coupling part coupling the shielding part to the second RF transmission part.

The shielding part may include a first dielectric layer and a first ground layer laminated on one surface of the first dielectric layer.

The first RF transmission part may include: a second dielectric layer; a first RF transmission line laminated on one surface of the second dielectric layer; a fourth ground layer laminated on the other surface of the second dielectric layer; and a third ground layer laminated on the same surface as that of the second dielectric layer, on which the first RF transmission line is laminated, wherein the third ground layer is provided in a pair, which are formed in parallel to be spaced a predetermined distance from each other with the first RF transmission line therebetween.

The second RF transmission part may include: a third dielectric layer; a second RF transmission line laminated on one surface of the third dielectric layer; a sixth ground layer laminated on the other surface of the third dielectric layer; and a fifth ground layer laminated on the same surface as that of the third dielectric layer, on which the second RF transmission line is laminated, wherein the fifth ground layer is provided in a pair, which are formed in parallel to be spaced a predetermined distance from each other with the second RF transmission line therebetween.

The first RF transmission line of the substrate part and the first RF transmission line of the transmission part may be formed on the same surface on the second dielectric layer.

The second RF transmission line of the substrate part and the second RF transmission line of the transmission part may be formed on the same surface of the third dielectric layer.

The first RF transmission line of the substrate part and the first RF transmission line of the transmission part may be formed on different surfaces of the second dielectric layer and electrically conducted by using a via hole as a medium.

The second RF transmission line of the substrate part and the second RF transmission line of the transmission part may be formed on different surfaces of the third dielectric layer and electrically conducted by using a via hole as a medium.

The flexible circuit board may further include a first auxiliary shielding part formed on an upper portion of the first RF transmission part and a second auxiliary shielding part formed on a lower portion of the second RF transmission part.

The shielding part may further include a second ground layer laminated on the other surface of the first dielectric layer.

In the substrate part, the shielding part may further include a second ground layer laminated on the other surface of the first dielectric layer.

In the substrate part, the first ground layer may have a plate shape, and each of the second ground layer, the fourth ground layer, and the sixth ground layer may be provided in a pair, which are formed in parallel to be spaced a predetermined distance from each other, and in the transmission part, each of the first ground layer, the second ground layer, the fourth ground layer, and the sixth ground layer may have a shape in which a plurality of net-shaped meshes are formed.

In the substrate part, the first auxiliary shielding part may include a fourth dielectric layer and a seventh ground layer laminated on one surface of the fourth dielectric layer and having a plurality of ground holes, which are formed to be spaced a predetermined distance from each other, and the second auxiliary shielding part may include a fifth dielectric layer and an eighth ground layer laminated on one surface of the fifth dielectric layer and having a plurality of ground holes, which are formed to be spaced a predetermined distance from each other, and in the transmission part, the first auxiliary shielding part may include a fourth dielectric layer and a seventh ground layer which is laminated on one surface of the fourth dielectric layer and in which a plurality of net-shaped meshes are formed, and the second auxiliary shielding part may include a fifth dielectric layer and an eighth ground layer which is laminated on one surface of the fifth dielectric layer and in which a plurality of net-shaped meshes are formed.

In the substrate part, the first ground layer may have a plate shape, the second ground layer may be provided in a pair, which are formed in parallel to be spaced a predetermined distance from each other, and the fourth ground layer may have a shape in which a plurality of net-shaped meshes are formed, and the sixth ground layer may have a shape in which a plurality of ground holes are spaced a predetermined distance from each other, and in the transmission part, each of the first ground layer, the fourth ground layer, and the sixth ground layer may have a shape in which a plurality of net-shaped meshes are formed.

In the substrate part, the first auxiliary shielding part may include a fourth dielectric layer and a seventh ground layer laminated on one surface of the fourth dielectric layer and provided in a pair, which are formed in parallel to be spaced a predetermined distance from each other, and the second auxiliary shielding part may include a fifth dielectric layer and an eighth ground layer laminated on one surface of the fifth dielectric layer and provided in a pair, which are formed in parallel to be spaced a predetermined distance from each other, and in the transmission part, the first auxiliary shielding part may include a fourth dielectric layer, and the second auxiliary shielding part may include a fifth dielectric layer.

In the substrate part, the first ground layer may have a plate shape, each of the second ground layer and the sixth ground layer may be provided in a pair, which are formed in parallel to be spaced a predetermined distance from each other, and the fourth ground layer may have a plurality of net-shaped meshes, and in the transmission part, each of the first ground layer, the fourth ground layer, and the sixth ground layer may have a shape in which a plurality of net-shaped meshes are formed, and the second ground layer may have a plate shape.

In the substrate part, the first auxiliary shielding part may include a fourth dielectric layer and a seventh ground layer laminated on one surface of the fourth dielectric layer and provided in a pair, which are formed to be spaced a predetermined distance from each other, and the second auxiliary shielding part may include a fifth dielectric layer and an eighth ground layer laminated on one surface of the fifth dielectric layer and provided in a pair, which are formed to be spaced a predetermined distance from each other, and in the transmission part, the first auxiliary shielding part may include a fourth dielectric layer, and the second auxiliary shielding part may include a fifth dielectric layer and an eighth ground layer which is laminated on one surface of the fifth dielectric layer and in which a plurality of net-shaped meshes are formed.

In the substrate part, each of the first ground layer, the fourth ground layer, and the sixth ground layer may have a shape in which a plurality of net-shaped meshes are formed, and the second ground layer has a plate shape, and in the transmission part, each of the first ground layer, the fourth ground layer, and the sixth ground layer may have a shape in which a plurality of net-shaped meshes are formed, and the second ground layer may have a plate shape.

In the substrate part, the first auxiliary shielding part may include a fourth dielectric layer and a seventh ground layer laminated on one surface of the fourth dielectric layer and having a plate shape, and the second auxiliary shielding part may include a fifth dielectric layer and an eighth ground layer which is laminated on one surface of the fifth dielectric layer and in which a plurality of net-shaped meshes are formed, and in the transmission part, the first auxiliary shielding part may include a fourth dielectric layer, and the second auxiliary shielding part may include a fifth dielectric layer and an eighth ground layer which is laminated on one surface of the fifth dielectric layer and in which a plurality of net-shaped meshes are formed.

The transmission part may further include cover layers on upper and lower portions of the shielding part, the first RF transmission part, and the second RF transmission part.

The flexible circuit board may further include a normal signal transmission part extending from the substrate part in addition to the transmission part, wherein the normal signal transmission part may be integrated with the transmission part, and at least one of a digital signal line, an analog signal line, a power source line, and a ground may be formed on one surface in which at least one of the first dielectric layer, the second dielectric layer, and the third dielectric layer extends in the width direction.

Advantageous Effects

According to the present invention, since the first RF transmission part and the second RF transmission part are disposed in the thickness direction with respect to the shielding part, the space occupied within the wireless terminal may be reduced. Also, since the transmission part extends from the substrate part, the number of connectors may be reduced, and the transmission length may be reduced to reduce the signal loss.

MODE FOR CARRYING OUT THE INVENTION

Figure 1:
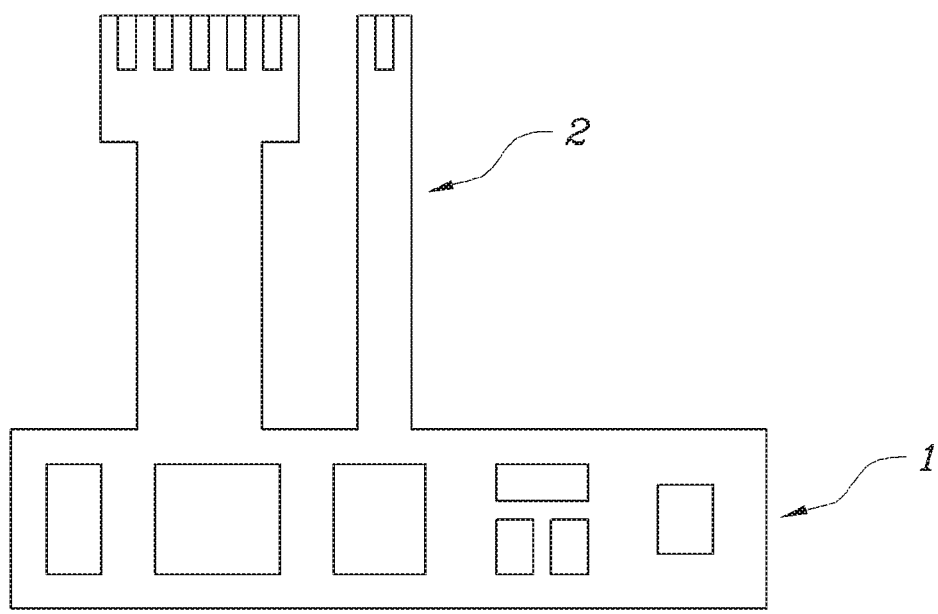
FIG. 1 is a view illustrating a schematic configuration of a flexible circuit board according to the present invention.

The objectives, specific advantages, and novel features of the present invention will become more apparent from the following detailed description and embodiments taken in conjunction with the accompanying drawings. It should be noted that the reference numerals are added to the components of the drawings in the present specification with the same numerals as possible, even if they are illustrated in other drawings. Also, it will be understood that although the terms such as 'first' and 'second' are used herein to describe various elements, these elements should not be limited by these terms. The terms are only used to distinguish one component from other components. Moreover, detailed descriptions related to well-known functions or configurations will be ruled out in order not to unnecessarily obscure subject matters of the present disclosure.

Hereinafter, specific embodiments will be described in detail with reference to the accompanying drawings.

As illustrated in FIG. 1, a flexible circuit board according to the present invention includes a substrate part and a transmission part.

In a wireless terminal, the substrate part 1 may be a rigid part such as a main board or a sub board, and the transmission part 2 may be a flexible part electrically connecting the rigid part.

FIGS. 2(a) and 2(b) are cross-sectional views respectively illustrating the substrate part 1 and the transmission part 2 of the flexible circuit board according to the present invention.

Figure 2:
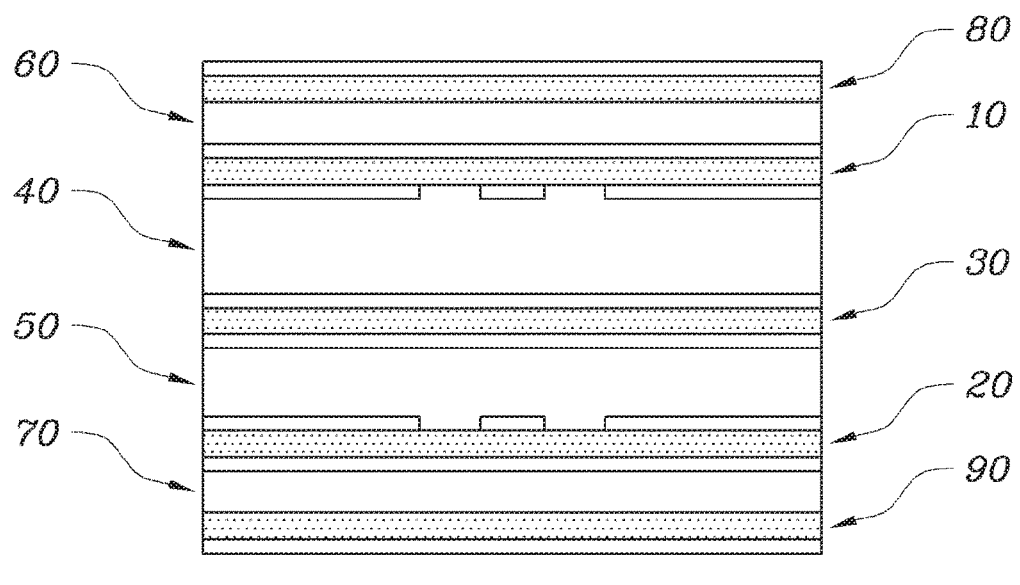
FIGS. 2(a) and 2(b) are cross-sectional views respectively illustrating a substrate part and a transmission part of the flexible circuit board according to the present invention.
Figure 2:
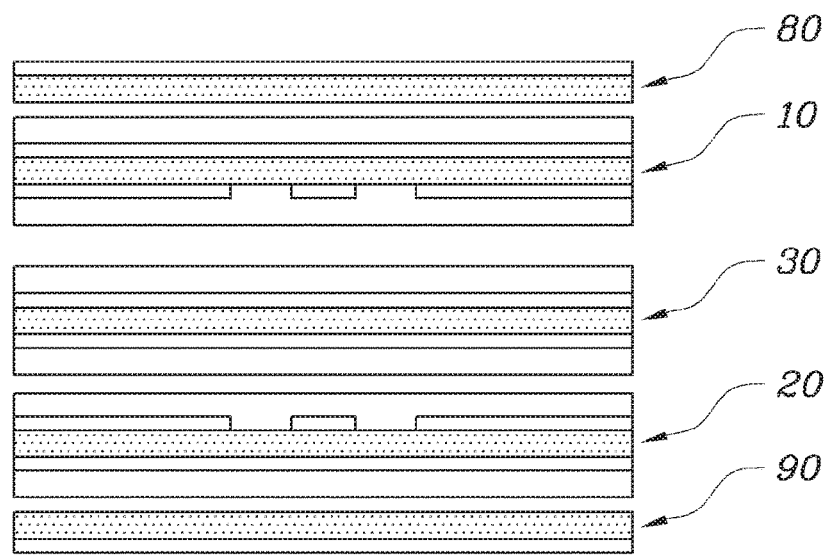
Figure 3:
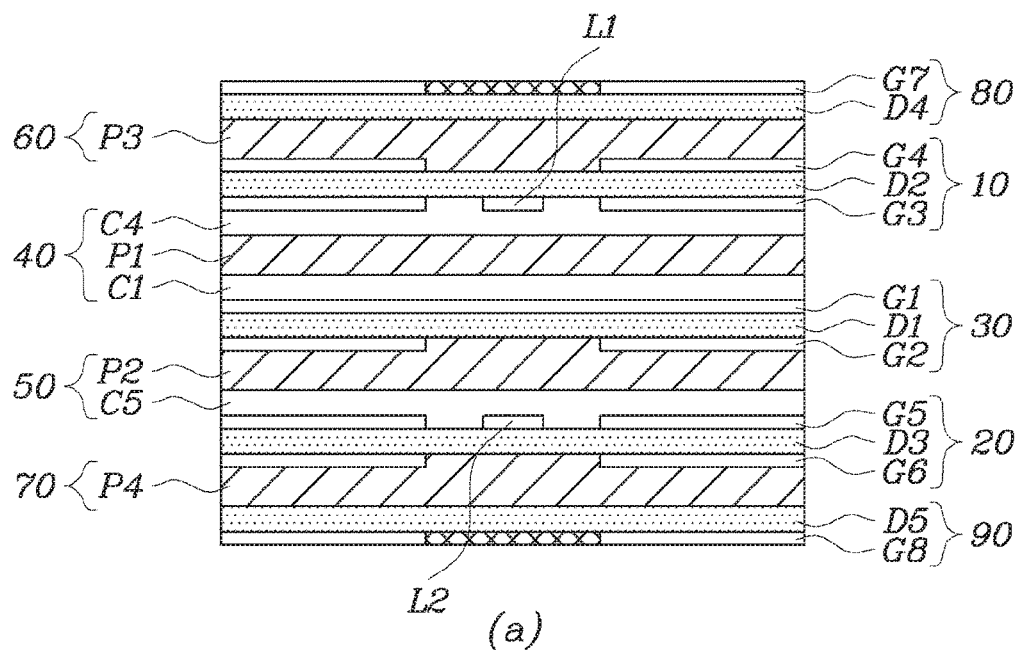
FIGS. 3(a) and 3(b) are cross-sectional views respectively illustrating a substrate part and a transmission part of a flexible circuit board according to a first embodiment of the present invention.
Figure 3:
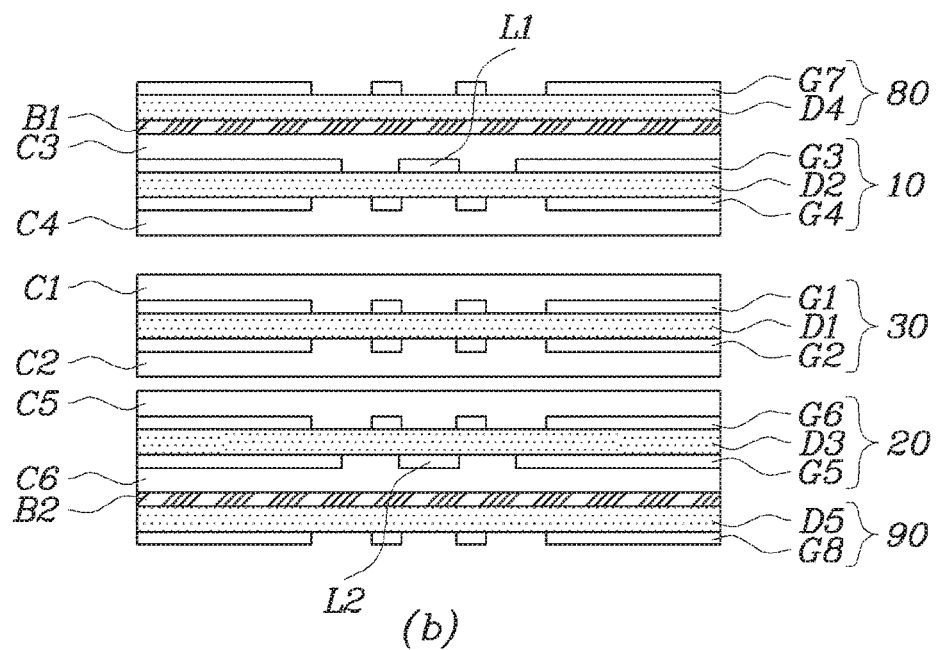

As illustrated in FIG. 2, in the transmission part 2, two or more lines extending from the substrate part 1 to transmit a high frequency are arranged in parallel to each other in a thickness direction. Thus, the transmission part 2 may include a shielding part 30, a first radio frequency (RF) transmission part 10, and a second RF transmission part 20. Each of the substrate part 1 and the transmission part 2 may include the shielding part 30, the first RF transmission part 10, and the second RF transmission part 20. In the substrate part 1, the shielding part 30 and the first RF transmission part 10 may be coupled to each other by using a first coupling part 40 as a medium, and the shielding part 30 and the second RF transmission part 20 may be coupled to each other by using a second coupling part 50 as a medium.

That is, in the substrate part 1, the first RF transmission part 10 is disposed above the shielding part 30, and the second RF transmission part 20 is disposed below the shielding part 30. The shielding part 30 and the first RF transmission part 10 are coupled to each other by using the first coupling part 40 as the medium, and the shielding part 30 and the second RF transmission part 20 are coupled to each other by using the second coupling part 50 as the medium. Thus, the shielding part 30, the first RF transmission part 10, and the second RF transmission part 20 except for the first coupling part 40 and the second coupling part 40 may extend from the substrate part 1 to form the transmission part 2.

Thus, since the first RF transmission part 10 and the second RF transmission part 20 are disposed in the thickness direction with respect to the shielding part 30, a space occupied within the wireless terminal may be reduced. Also, since the transmission part 2 extends from the substrate part 1, the number of connectors may be reduced, and a transmission length may be reduced to reduce a signal loss.

In the substrate part 1 and the transmission part 2, a first auxiliary shielding part 80 may be disposed above the first RF transmission part 10, and a second auxiliary shielding part 90 may be disposed below the second RF transmission part 20. In the substrate part 1, the first RF transmission part 10 and the first auxiliary shielding part 80 may be coupled to each other by using a third coupling part 60 as a medium, and the second RF transmission part 20 and the second auxiliary shielding part 90 may be coupled to each other by using a fourth coupling part 70 as a medium.

The first coupling part 40, the second coupling part 50, the third coupling part 60, and the fourth coupling part 70 may include at least one of a prepreg (PP), a cover layer, and a bonding sheet. In addition, other components may be included depending on designer's intention as long as the coupling parts are components suitable for coupling the shielding part 30, the first RF transmission part 10, the second RF transmission part 20, the second RF transmission part 20, the first auxiliary shielding part 80, and the second auxiliary shielding part 90, which are described above.

Also, it is preferable that the substrate part 1 is rigid by including the prepreg so that the components are mounted thereon.

Hereinafter, flexible circuit boards according to first to fourth embodiments will be described in detail with reference to FIGS. 3 to 7.

As illustrated in FIGS. 3(a) and 3(b), a first RF transmission part 10 of the flexible circuit board according to the first embodiment of the present invention may include a second dielectric layer D2, a first RF transmission line L1, a fourth ground layer G4, and a third ground layer G3.

The second dielectric layer D2 may extend from the substrate part 1 to the transmission part 2. In the substrate part 1, the first RF transmission line L1 may be formed to be laminated on a bottom surface of the second dielectric layer D2, and the fourth ground layer G4 may be formed to be laminated on a plane of the second dielectric layer.

Also, in the transmission part 2, the first RF transmission line L1 may be formed to be laminated on the plane of the second dielectric layer D2, and the fourth ground layer G4 may be formed to be laminated on the bottom surface of the second dielectric layer D2.

In the second dielectric layer D2, the third ground layer G3 may be laminated on the same surface as the surface on which the first RF transmission line L1 is laminated. The pair of third ground layers G3 may be formed in parallel to be spaced a predetermined distance from each other with the first RF transmission line L1 therebetween.

The second RF transmission part 20 may include a third dielectric layer D3, a second RF transmission line L2, a sixth ground layer G6, and a fifth ground layer G5.

The third dielectric layer D3 may be formed to extend from the substrate part 1 to the transmission part 2. In the substrate part 1, the second RF transmission line L2 may be formed to be laminated on a plane of the third dielectric layer D3, and the sixth ground layer G6 may be formed to be laminated on a bottom surface of the third dielectric layer D3.

Also, in the transmission part 2, the second RF transmission line L2 may be formed to be laminated on the bottom surface of the third dielectric layer D3, and the sixth ground layer G6 may be formed to be laminated on the plane of the third dielectric layer D3.

In the third dielectric layer D3, the firth ground layer G5 may be laminated on the same surface as the surface on which the second RF transmission line L2 is laminated. The pair of fifth ground layers G5 may be formed in parallel to be spaced a predetermined distance from each other with the second RF transmission line L2 therebetween.

Although the first RF transmission line L1 and the second RF transmission line L2 are respectively formed to be laminated on different surfaces of the second dielectric layer D2 and the third dielectric layer D3 of the substrate part 1 and the transmission part 2 in FIGS. 3(a) and 3(b), the first RF transmission line L1 of the substrate part 1 and the first RF transmission line L1 of the transmission part 2 may be formed to be laminated on the same surface of the second dielectric layer D2 as necessary.

Also, the second RF transmission line L2 of the substrate part 1 and the second RF transmission line L2 of the transmission part 2 may be formed to be laminated on the same surface of the third dielectric layer D3.

When the first RF transmission line L1 and the second RF transmission line L2 are respectively formed to be laminated on the different surfaces of the second dielectric layer D2 and the third dielectric layer D3 in the substrate part 1 and the transmission part 2, the first RF transmission line L1 and the second RF transmission line L2 have to be electrically conducted by using a via hole (not shown) as a medium.

When the first RF transmission lines L1 are respectively formed to be laminated on the different surfaces of the second dielectric layers D2 in the substrate part 1 and the transmission part 2, the fourth ground layer G4 of the substrate part 1 may extend to be formed as the third ground layer G3 of the transmission part 2, and the third ground layer G3 of the substrate part 1 may extend to be formed as the fourth ground layer G4 of the transmission part 2.

Also, when the second RF transmission lines L2 are respectively formed to be laminated on the different surfaces of the third dielectric layers D3 in the substrate part 1 and the transmission part 2, the sixth ground layer G6 of the substrate part 1 may extend to be formed as the fifth ground layer G5 of the transmission part 2, and the fifth ground layer G5 of the substrate part 1 may extend to be formed as the sixth ground layer G6 of the transmission part 2.

The shielding part 30 may be disposed between the first RF transmission part 10 and the second RF transmission part 20, a first auxiliary shielding part 80 may be disposed above the first RF transmission part 10, and a second auxiliary shielding part 90 may be disposed below the second RF transmission part 20.

The above-described shielding part 30 may be configured to prevent signals of the first RF transmission part 10 and the second RF transmission part 20 from interfering with each other. The first auxiliary shielding part 80 and the second auxiliary shielding part 90 may respectively prevent signals of the first RF transmission part 10 and the components of the wireless terminal and signals of the second RF transmission part 20 and the components of the wireless terminal from interfering with each other.

The shielding part 30 may include the first dielectric layer D1, the first ground layer G1 laminated on one surface of the first dielectric layer D1, and the second ground layer G2 laminated on the other surface of the first dielectric layer D1.

Although the shielding part 30 includes the first dielectric layer D1, the first ground layer G1 laminated on one surface of the first dielectric layer D1, and the second ground layer G2 laminated on the other surface of the first dielectric layer D1 in FIGS. 3(a) and 3(b), the second ground layer G2 laminated on the other surface may be omitted as necessary.

In the substrate part 1, the shielding part 300 and the first RF transmission part 10 may be coupled to each other by using a first coupling part 40 as a medium, and the first coupling part 40 may include a first cover layer C1, a fourth cover layer C4, and a first prepreg P1.

Also, in the substrate part 1, the shielding part 300 and the second RF transmission part 20 may be coupled to each other by using a second coupling part 50 as a medium, and the second coupling part 50 may include a fifth cover layer C5 and a second prepreg P2.

The first auxiliary shielding part 80 may include a fourth dielectric layer D4 and a seventh ground layer G7 laminated on a plane of the fourth dielectric layer D4.

In the substrate part 1, the first auxiliary shielding part 80 and the first RF transmission part 10 may be coupled to each other by using a third coupling part 60 as a medium, and the third coupling part 60 may include a third prepreg P3.

The second auxiliary shielding part 90 may include a fifth dielectric layer D5 and an eighth ground layer G8 laminated on a bottom surface of the fifth dielectric layer D5.

In the substrate part 1, the second auxiliary shielding part 90 and the second RF transmission part 20 may be coupled to each other by using a fourth coupling part 70 as a medium, and the fourth coupling part 70 may include a fourth prepreg P4.

The first RF transmission part 10 of the transmission part 2 may include a third cover layer C3 covering an upper portion and a fourth cover layer C4 covering a lower portion.

The second RF transmission part 20 of the transmission part 2 may include a fifth cover layer C5 covering an upper portion and a sixth cover layer C6 covering a lower portion.

The shielding part 30 of the transmission part 2 may include a first cover layer C1 covering an upper portion and a second cover layer C2 covering a lower portion.

The first RF transmission part 10 and the second RF transmission part 20 of the first substrate part 1 are respectively coupled by the shielding part 30, the first coupling part 40, and the second coupling part 50, but the transmission part 2 does not include the first coupling part 40 and the second coupling part 50. Thus, the first RF transmission part 10, the second RF transmission part 20, and the shielding part 30 of the transmission part 2 may be separated from each other.

In the transmission part 2, the first auxiliary shielding part 80 may include a fourth dielectric layer D4 and a seventh ground layer G7 laminated on a plane of the fourth dielectric layer D4.

The first RF transmission part 10 and the first auxiliary shielding part 80 of the transmission part 2 may be coupled to each other by using a first bonding sheet B1 as a medium.

In the transmission part 2, the second auxiliary shielding part 90 may include a fifth dielectric layer D5 and an eighth ground layer G8 laminated on a bottom surface of the fifth dielectric layer D5.

The second RF transmission part 20 and the second auxiliary shielding part 90 of the transmission part 2 may be coupled to each other by using a second bonding sheet B2 as a medium.

As illustrated in FIGS. 3(a) and 3(b) and FIGS. 7(a) to 7(d), the first ground layer G1 of the substrate part 1 may be formed in a plate shape (see FIG. 7(a)), and each of the second ground layer G2, the fourth ground layer G4, and the sixth ground layer G6 may be formed in a pair that is formed in parallel to be spaced a predetermined distance from each other.

Each of the seventh ground layer G7 and the eighth ground layer G8 of the substrate part 1 may have a plurality of ground holes that are formed to be spaced a predetermined distance from each other (see FIG. 7(c)).

Also, in the transmission part 2, a plurality of net-shaped meshes may be formed in each of the first ground layer G1, the second ground layer G2, the fourth ground layer G4, the sixth ground layer G6, the seventh ground layer G7, and the eighth ground layer G8 (see FIG. 7(d)).

As described above, it is preferable that the flexible circuit board according to the first embodiment of the present invention is applied when the other component is close to the upper portion of the substrate part 1, a metal is close to the lower portion of the substrate part 1, and the other component is spaced apart from the transmission part 2.

Figure 4:
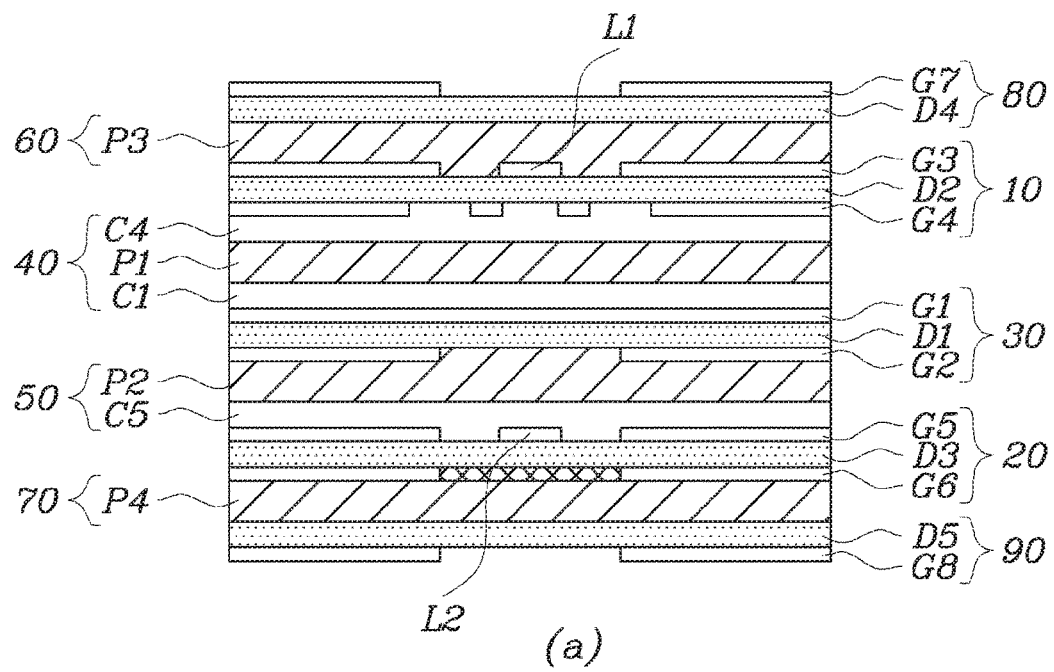
FIGS. 4(a) and 4(b) are cross-sectional views respectively illustrating a substrate part and a transmission part of a flexible circuit board according to a second embodiment of the present invention.
Figure 4:
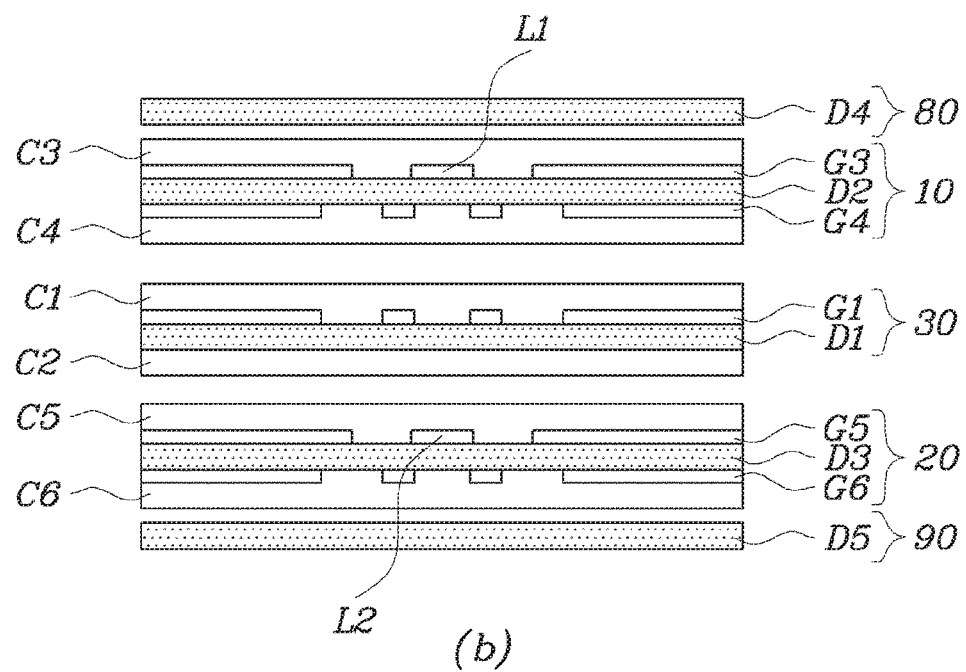
Figure 5:
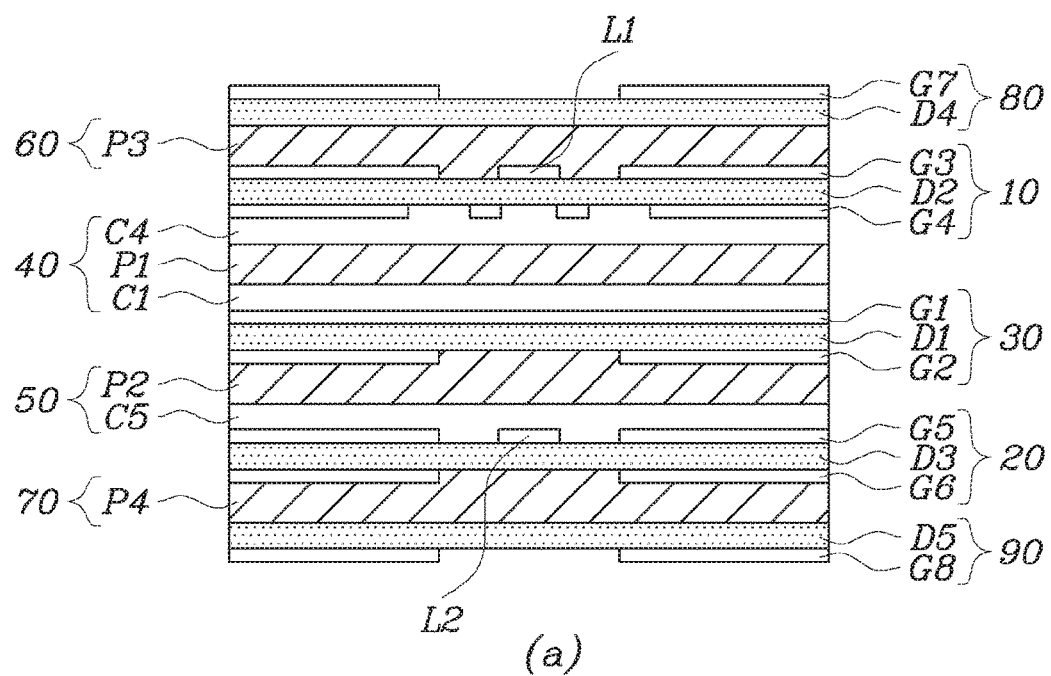
FIGS. 5(a) and 5(b) are cross-sectional views respectively illustrating a substrate part and a transmission part of a flexible circuit board according to a third embodiment of the present invention.
Figure 5:
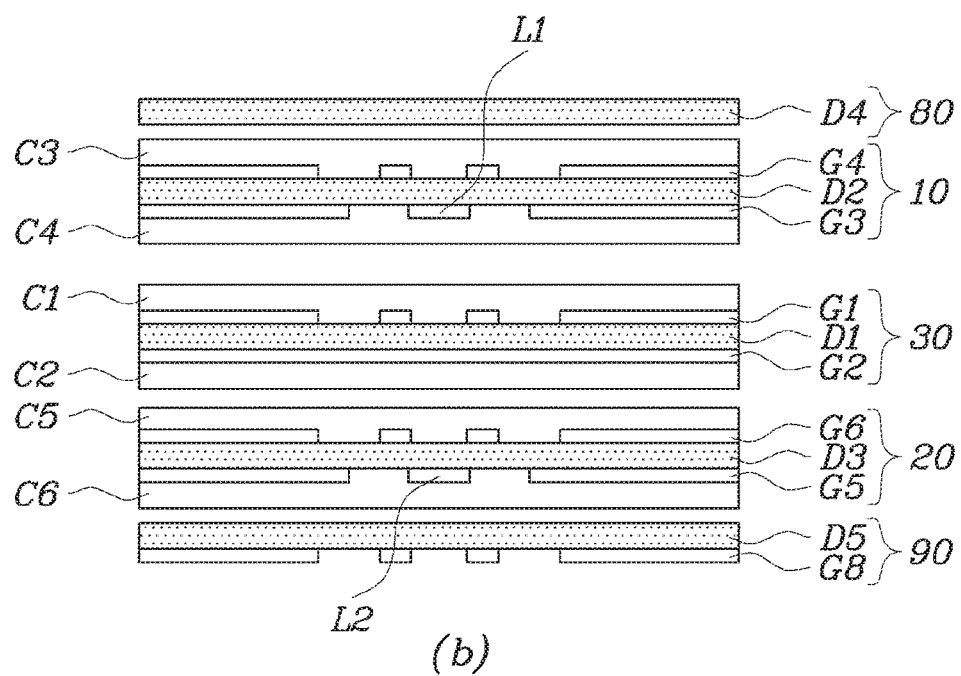
Figure 6:
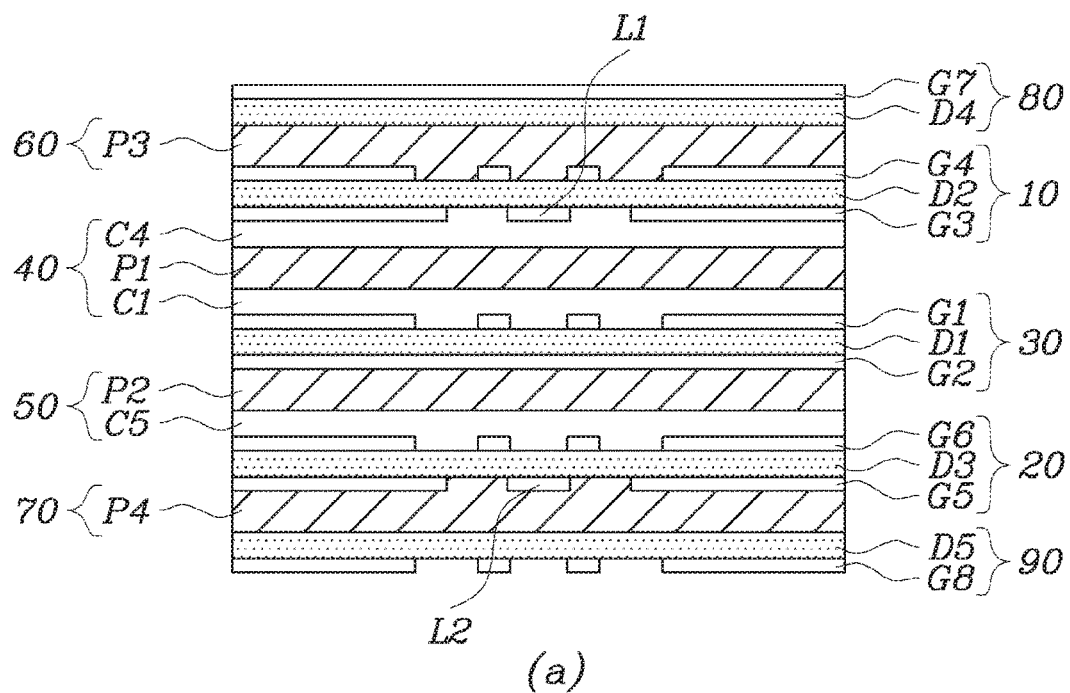
FIGS. 6(a) and 6(b) are cross-sectional views respectively illustrating a substrate part and a transmission part of a flexible circuit board according to a fourth embodiment of the present invention.
Figure 6:
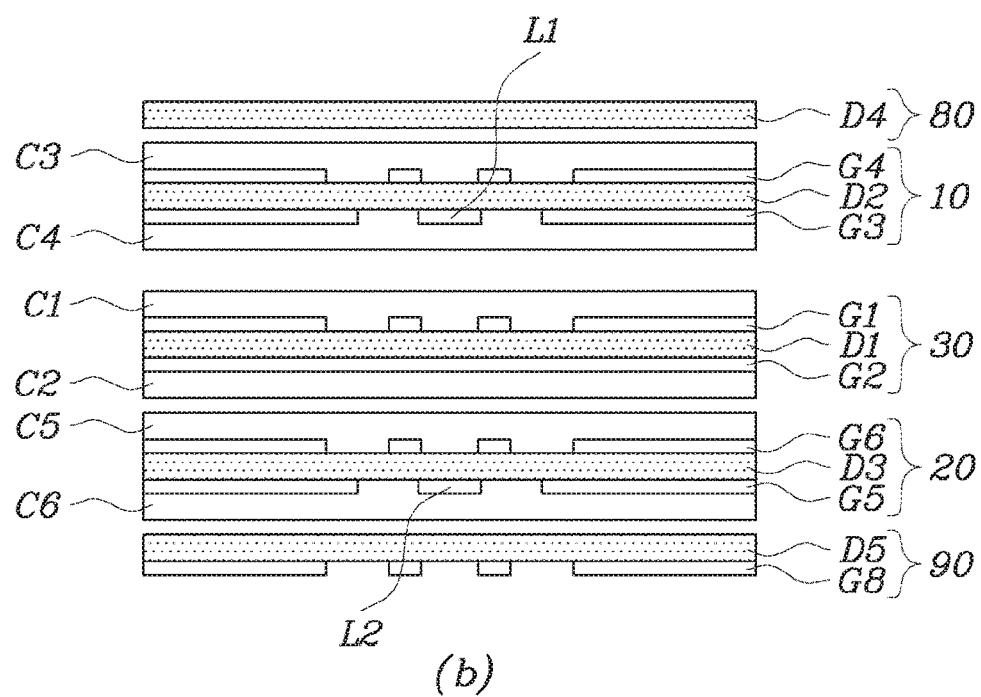
Figure 7:
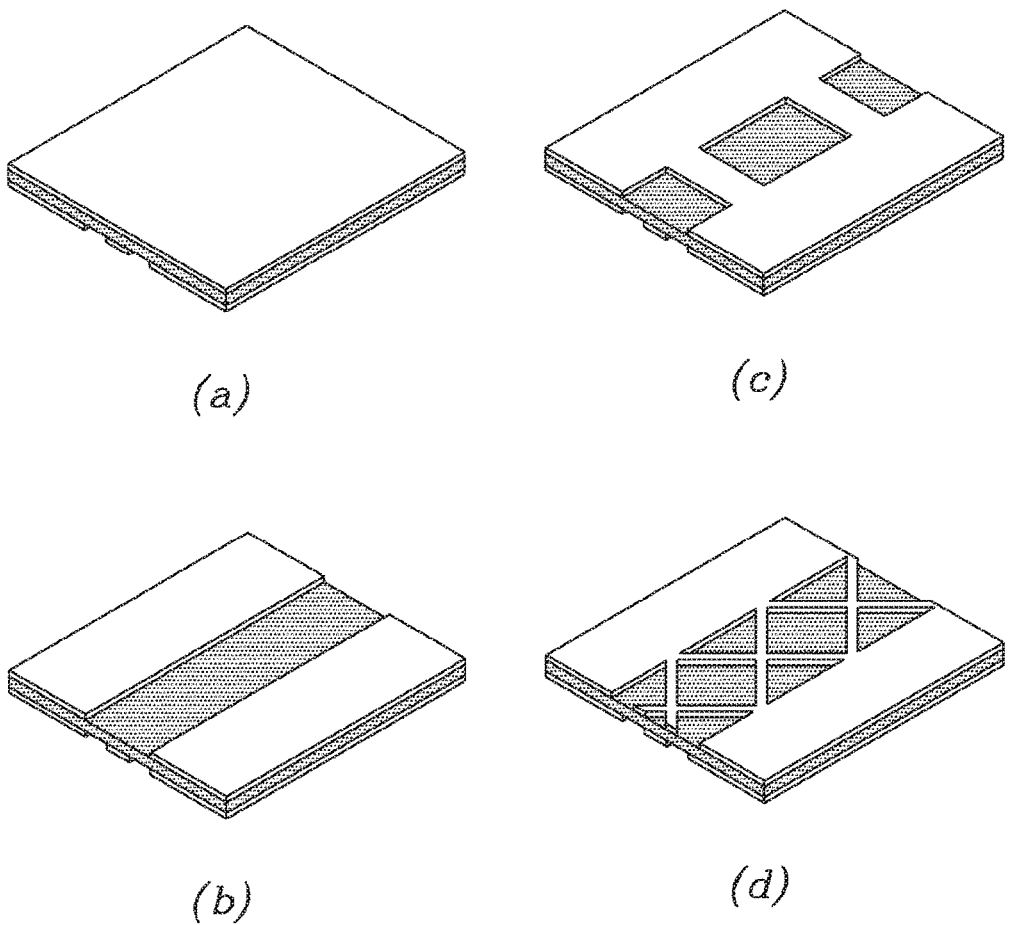
FIG. 7(a) is a view illustrating a ground layer that is one main component of the flexible circuit board according to the first embodiment of the present invention.
FIG. 7(b) is a view illustrating a ground layer that is one main component of the flexible circuit board according to the second embodiment of the present invention.
FIG. 7(c) is a view illustrating a ground layer that is one main component of the flexible circuit board according to the third embodiment of the present invention.
FIG. 7(d) is a view illustrating a ground layer that is one main component of the flexible circuit board according to the fourth embodiment of the present invention.

Hereinafter, a flexible circuit board according to a second embodiment of the present invention will be described with reference to FIGS. 4(a) and 4 (b) and FIGS. 7(a) to 7(d).

In description of the flexible circuit board according to the second embodiment of the present invention, descriptions duplicated with those of the first embodiment will be derived from the descriptions of the first embodiment, and configurations different from those of the first embodiment will be mainly described.

Unlike the first embodiment, in the flexible circuit board according to the second embodiment of the present invention, a first RF transmission line L1 of a substrate part 1 and a first RF transmission line L1 of a substrate part 2 are formed on the same surface of a second dielectric layer D2, and a second RF transmission line L2 of the substrate part 1 and a second RF transmission line L2 of the transmission part 2 are formed on the same surface of a third dielectric layer D3.

In more detail, the first RF transmission line L1 may be formed to be laminated on a plane of the second dielectric layer D2 in the substrate part 1 and the transmission part 2, and the second RF transmission line L2 is formed to be laminated on a plane of the third dielectric layer D3 in the substrate part 1 and the transmission part 2.

The first RF transmission line L1 and the second RF transmission line L2 may be respectively formed to be laminated on bottom surfaces of the second dielectric layer D2 and the third dielectric layer D3, and this structure may be changed in design with various structures depending on designer's intension.

Unlike the first embodiment, in the second embodiment of the present invention, the second ground layer G2 is omitted in a shielding part 30 of the transmission part 2, the seventh ground layer G7 and the first bonding sheet B1 are omitted in a first auxiliary shielding part 80, and the eighth ground layer G8 and the second bonding sheet B2 are omitted in a second auxiliary shielding part 90.

As illustrated in FIGS. 4(a) and 4(b) and FIGS. 7(a) to 7(d), a first ground layer G1 of the substrate part 1 may be laminated on a plane of a first dielectric layer D1 in a plate shape (see FIG. 7(a), a second ground layer G2 may be formed in a pair, which are laminated in parallel to be spaced a predetermined distance from each other and laminated on a bottom surface of the first dielectric layer D1 (see FIG. 7(b)), and a plurality of net-shaped meshes may be formed in a fourth ground layer G4 (see FIG. 7(d)). Thus, a plurality of ground holes may be formed to be spaced a predetermined distance from each other in a sixth ground layer G6 (see FIG. 6(c)).

A seventh ground layer G7 laminated on one surface of a fourth dielectric layer D4 may be formed in a pair, which are formed in parallel to be spaced a predetermined distance from each other (see FIG. 6(b)), and an eighth ground layer G8 laminated on one surface of a fifth electric layer D5 may also be formed in the same manner as the seventh ground layer G7.

In the transmission part 2, a plurality of net-shaped meshes may be formed in each of the first ground layer G1, the fourth ground layer G4, and the sixth ground layer G6 (see FIG. 7(d)).

As described above, it is preferable that the flexible circuit board according to the second embodiment of the present invention is applied when the other component is close to an upper portion of the substrate part 1, a metal is close to a lower portion of the substrate part 1, and the other component is spaced apart from an upper portion the transmission part 2 and close to a lower portion of the transmission part 2.

Hereinafter, a flexible circuit board according to a third embodiment of the present invention will be described with reference to FIGS. 5(a) and 4 (b) and FIGS. 7(a) to 7(d).

In description of the flexible circuit board according to the third embodiment of the present invention, descriptions duplicated with those of the foregoing embodiments will be derived from the previous description, and configurations different from those of the foregoing embodiment will be mainly described.

In the flexible circuit board according to the third embodiment of the present invention, a substrate part 1 is the same as that according to the second embodiment except for a configuration of a sixth ground layer G6.

Unlike the second embodiment, the sixth ground layer G6 of the substrate part 1 is formed in a pair, which are formed to be laminated in parallel to be spaced a predetermined distance from each other (see FIG. 7(b)).

Like the first embodiment, in the flexible circuit board according to the third embodiment of the present invention, a first RF transmission line L1 and a second RF transmission line L2 of the substrate part 1 are respectively formed to be laminated on layers different from those of a first RF transmission line L1 and a second RF transmission line L2 of a transmission part 2.

In more detail, in the substrate part 1, the first RF transmission line L1 is laminated on a plane of a second dielectric layer D2, and the second RF transmission line L2 is laminated on a plane of a third dielectric layer D3. In the transmission part 2, the first RF transmission line L1 is formed to be laminated on a bottom surface of the second dielectric layer D2, and the second RF transmission line L2 is formed to be laminated on a bottom surface of the third dielectric layer D3.

In the transmission part 2, a first auxiliary shielding part 80 has the same structure as the first auxiliary shielding part 80 according to the foregoing second embodiment.

In the transmission part 2, a second auxiliary shielding part 90 may include a fifth dielectric layer D5 and an eighth ground layer G8 laminated on a bottom surface of the fifth dielectric layer D5.

As illustrated in FIGS. 5(a) and 5(b) and FIGS. 7(a) to 7(d), in the transmission part 2, a plurality of net-shaped meshes may be formed in each of a first ground layer G1, a fourth ground layer G4, a sixth ground layer G6, and an eighth ground layer G8 (see FIG. 7(d)), and the second ground layer G2 may be formed in a plate shape (see FIG. 7(a)).

As described above, it is preferable that the flexible circuit board according to the third embodiment of the present invention is applied when the other component is spaced apart from an upper portion of the substrate part 1, a metal is close to a lower portion of the transmission part 2, and the other component is close to an upper portion of the transmission part 2 and spaced apart from the lower portion of the transmission part 2.

Hereinafter, a flexible circuit board according to a fourth embodiment of the present invention will be described with reference to FIGS. 6(a) and 6(b) and FIGS. 7(a) to 7(d).

In description of the flexible circuit board according to the fourth embodiment of the present invention, descriptions duplicated with those of the foregoing embodiments will be derived from the previous description, and configurations different from those of the foregoing embodiment will be mainly described.

Like the second embodiment, in the flexible circuit board according to the fourth embodiment of the present invention, a first RF transmission line L1 of a substrate part 1 and a first RF transmission line L1 of a substrate part 2 are formed on the same surface of a second dielectric layer D2, and a second RF transmission line L2 of the substrate part 1 and a second RF transmission line L2 of the transmission part 2 are formed on the same surface of a third dielectric layer D3.

In more detail, in the substrate part 1, the first RF transmission line L1 is laminated on a bottom surface of the second dielectric layer D2, and the second RF transmission line L2 is laminated on a bottom surface of a third dielectric layer D3. In the transmission part 2, the first RF transmission line L1 is formed to be laminated on a bottom surface of the second dielectric layer D2, and the second RF transmission line L2 is formed to be laminated on a bottom surface of the third dielectric layer D3.

Third ground layers G3 formed in parallel to be spaced a predetermined distance from each other with the first RF transmission line L1 therebetween is laminated on the bottom surface of the second dielectric layer D2, and fifth ground layers G5 formed in parallel to be spaced a predetermined distance from each other with the second RF transmission line L2 therebetween is laminated on the bottom surface of the third dielectric layer D3.

As illustrated in FIGS. 6(a) and 6(b) and FIGS. 7(a) to 7(d), in the substrate part 1, a plurality of net-shaped meshes may be formed in each of a first ground layer G1, a fourth ground layer G4, a sixth ground layer G6, and an eighth ground layer G8 (see FIG. 7(d)), and each of the second ground layer G2 and the seventh ground layer G7 may be formed in a plate shape (see FIG. 7(a)).

In the flexible circuit board according to the fourth embodiment of the present invention, the transmission part 2 has the same structure as the transmission part 2 according to the forgoing third embodiment.

As described above, it is preferable that the flexible circuit board according to the fourth embodiment of the present invention is applied when the other component is close to an upper portion of the substrate part 1, a metal is spaced apart from a lower portion of the substrate part 1, and the other component is close to an upper portion of the transmission part 2 and spaced apart from a lower portion of the transmission part 2.

Figure 8:
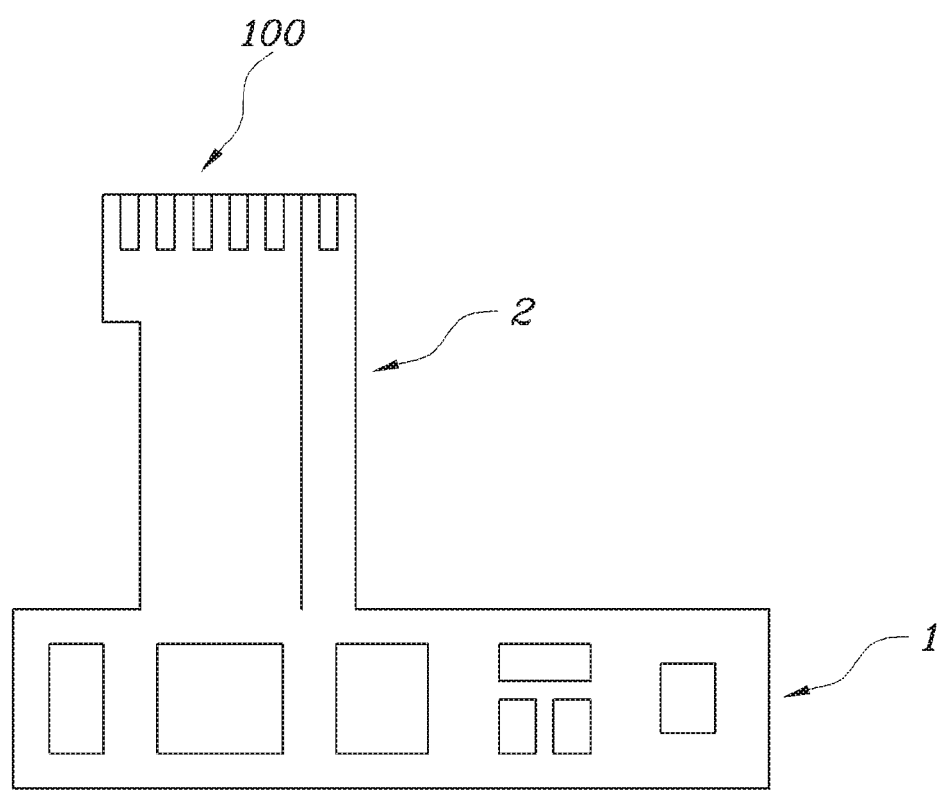
FIG. 8 is a view illustrating a configuration in which a normal signal transmission part that is one main component of the flexible circuit board is integrated with the transmission part according to the present invention.

As illustrated in FIG. 8, the flexible circuit board according to the present invention may further include a normal signal transmission part 100 extending from the substrate part 1 in addition to the transmission part 2. The normal signal transmission part 100 may be formed to be integrated with the transmission part 2.

The normal signal transmission part 100 may be formed by laminating at least one selected from a digital signal line, an analog signal line, a power source line, and a ground on one surface on which at least one of the first dielectric layer D1, the second dielectric layer D2, and the third dielectric layer D3 extends in a width direction.

While the present invention has been particularly shown and described with reference to exemplary embodiments thereof, the present invention is not limited to the flexible circuit board according to the present invention, and it will be apparent to those skilled in the art that variations and modifications may be made without departing from the scope of the present invention.

It will be understood by those skilled in the art that various changes in form and details may be made therein without departing from the spirit and scope of the invention as defined by the appended claims.

DESCRIPTION OF THE SYMBOLS

1: Substrate part 2: Transmission part
10: First RF transmission part 20: Second RF transmission part
30: Shielding part 40: First coupling part
50: Second coupling part 60: Third coupling part
70: Fourth coupling part 80: First auxiliary shielding part
90: Second auxiliary shielding part 100: Normal signal transmission part
D1: First dielectric layer D2: Second dielectric layer
D3: Third dielectric layer D4: Fourth dielectric layer
D5: Fifth dielectric layer G1: First ground layer
G2: Second ground layer G3: Third ground layer
G4: Fourth ground layer G5: Fifth ground layer
G6: Sixth ground layer G7: Seventh ground layer
G8: Eighth ground layer P1: First prepreg
P2: Second prepreg P3: Third prepreg
P4: Fourth prepreg L1: First RF transmission line
L2: Second RF transmission line C1: First cover layer
C2: Second cover layer C3: Third cover layer
C4: Fourth cover layer C5: Fifth cover layer
C6: Sixth cover layer B1: First bonding sheet
B2: Second bonding sheet

The invention claimed is:

1. A flexible circuit board, comprising:
a substrate part; and
a transmission part which is formed to extend from the substrate part and on which two or more lines transmitting a high frequency are arranged in parallel in a thickness direction,
wherein both of the substrate part and the transmission part comprise:
a shielding part,
a first radio frequency (RF) transmission part disposed to be spaced a first predetermined distance from the shielding part in the thickness direction, and
a second RF transmission part disposed to be spaced a second predetermined distance from the shielding part in the thickness direction, wherein the second RF transmission part is disposed to correspond to the first RF transmission part with the shielding part therebetween, and
wherein the shielding part, the first RF transmission part, and the second RF transmission part of the transmission part are formed to extend from the shielding part, the first RF transmission part, and the second RF transmission part of the substrate part, respectively.

2. The flexible circuit board of claim 1, wherein the transmission part further comprises cover layers on upper and lower portions of the shielding part, the first RF transmission part, and the second RF transmission part.

3. The flexible circuit board of claim 1, further comprising, a normal signal transmission part integrated with the transmission part and extending from the substrate part in a width direction,
wherein the normal signal transmission part includes a dielectric layer, and at least one of a digital signal line, an analog signal line, a power source line, and a ground is formed on one surface of the dielectric layer.

4. The flexible circuit board of claim 1, wherein the substrate part further comprises a first coupling part coupling the shielding part to the first RF transmission part and a second coupling part coupling the shielding part to the second RF transmission part, and wherein the transmission part does not include the first coupling part and the second coupling part.

5. The flexible circuit board of claim 4, wherein the shielding part comprises a first dielectric layer and a first ground layer laminated on one surface of the first dielectric layer.

6. The flexible circuit board of claim 5, wherein the first RF transmission part of the substrate part and the transmission part comprises:
a second dielectric layer;
a first RF transmission line laminated on one of a first or a second surface of the second dielectric layer;
a fourth ground layer laminated on another one of the first or the second surface of the second dielectric layer; and
a third ground layer laminated on the one of the first or the second surface of the second dielectric layer on which the first RF transmission line is laminated, wherein the third ground layer is provided in a pair, which are formed in parallel to be spaced a third predetermined distance from each other with the first RF transmission line therebetween.

7. The flexible circuit board of claim 6, wherein the first RF transmission line of the substrate part and the first RF transmission line of the transmission part are formed on different surfaces of the second dielectric layer and electrically connected by using a via hole as a medium.

8. The flexible circuit board of claim 6, wherein the second RF transmission part of the substrate part and the transmission part comprises:
a third dielectric layer;
a second RF transmission line laminated on one of a first or a second surface of the third dielectric layer;
a sixth ground layer laminated on another one of the first or the second surface of the third dielectric layer; and
a fifth ground layer laminated on the one of the first or the second surface of the third dielectric layer on which the second RF transmission line is laminated, wherein the fifth ground layer is provided in a pair, which are formed in parallel to be spaced a fourth predetermined distance from each other with the second RF transmission line therebetween.

9. The flexible circuit board of claim 8, wherein the second RF transmission line of the substrate part and the second RF transmission line of the transmission part are formed on different surfaces of the third dielectric layer and electrically connected by using a via hole as a medium.

10. The flexible circuit board of claim 8, further comprising, a first auxiliary shielding part formed on an upper portion of the first RF transmission part and a second auxiliary shielding part formed on a lower portion of the second RF transmission part.

11. The flexible circuit board of claim 10, wherein, in the substrate part, the shielding part further comprises a second ground layer laminated on another surface of the first dielectric layer.

12. The flexible circuit board of claim 11,
wherein, in the substrate part:
the first ground layer has a plate shape,
the second ground layer is provided in a pair, which are formed in parallel to be spaced a fifth predetermined distance from each other, and
the fourth ground layer has a shape in which a plurality of net-shaped meshes are formed, and
the sixth ground layer has a shape in which a plurality of ground holes are spaced a sixth predetermined distance from each other, and
wherein, in the transmission part, each of the first ground layer, the fourth ground layer, and the sixth ground layer has a shape in which a plurality of net-shaped meshes are formed.

13. The flexible circuit board of claim 12, wherein, in the substrate part:
the first auxiliary shielding part comprises a fourth dielectric layer and a seventh ground layer laminated on one surface of the fourth dielectric layer and provided in a pair, which are formed in parallel to be spaced a seventh predetermined distance from each other, and
the second auxiliary shielding part comprises a fifth dielectric layer and an eighth ground layer laminated on one surface of the fifth dielectric layer and provided in a pair, which are formed in parallel to be spaced an eighth predetermined distance from each other, and
wherein, in the transmission part:
the first auxiliary shielding part comprises the fourth dielectric layer, and
the second auxiliary shielding part comprises the fifth dielectric layer.

14. The flexible circuit board of claim 10, wherein the shielding part further comprises a second ground layer laminated on another surface of the first dielectric layer.

15. The flexible circuit board of claim 14, wherein, in the substrate part, the first ground layer has a plate shape, and each of the second ground layer, the fourth ground layer, and the sixth ground layer is provided in a pair, which are formed in parallel to be spaced a fifth predetermined distance from each other, and
wherein, in the transmission part, each of the first ground layer, the second ground layer, the fourth ground layer, and the sixth ground layer has a shape in which a plurality of net-shaped meshes are formed.

16. The flexible circuit board of claim 15, wherein, in the substrate part:
the first auxiliary shielding part comprises a fourth dielectric layer and a seventh ground layer laminated on one surface of the fourth dielectric layer and having a plurality of ground holes, which are formed to be spaced a seventh predetermined distance from each other, and
the second auxiliary shielding part comprises a fifth dielectric layer and an eighth ground layer laminated on one surface of the fifth dielectric layer and having a plurality of ground holes, which are formed to be spaced an eighth predetermined distance from each other, and wherein, in the transmission part:
the first auxiliary shielding part comprises the fourth dielectric layer and the seventh ground layer which is laminated on one surface of the fourth dielectric layer and in which a plurality of net-shaped meshes are formed, and
the second auxiliary shielding part comprises the fifth dielectric layer and the eighth ground layer which is laminated on one surface of the fifth dielectric layer and in which a plurality of net-shaped meshes are formed.

17. The flexible circuit board of claim 14, wherein, in the substrate part:
the first ground layer has a plate shape,
each of the second ground layer and the sixth ground layer is provided in a pair, which are formed in parallel to be spaced a fifth predetermined distance from each other, and
the fourth ground layer has a plurality of net-shaped meshes, and
wherein in the transmission part:
each of the first ground layer, the fourth ground layer, and the sixth ground layer has a shape in which a plurality of net-shaped meshes are formed, and
the second ground layer has a plate shape.

18. The flexible circuit board of claim 17, wherein, in the substrate part:
the first auxiliary shielding part comprises a fourth dielectric layer and a seventh ground layer laminated on one surface of the fourth dielectric layer and provided in a pair, which are formed to be spaced a sixth predetermined distance from each other, and
the second auxiliary shielding part comprises a fifth dielectric layer and an eighth ground layer laminated on one surface of the fifth dielectric layer and provided in a pair, which are formed to be spaced a seventh predetermined distance from each other, and
wherein, in the transmission part:
the first auxiliary shielding part comprises the fourth dielectric layer, and
the second auxiliary shielding part comprises the fifth dielectric layer and the eighth ground layer which is laminated on one surface of the fifth dielectric layer and in which a plurality of net-shaped meshes are formed.

19. The flexible circuit board of claim 14, wherein, in the substrate part, each of the first ground layer, the fourth ground layer, and the sixth ground layer has a shape in which a plurality of net-shaped meshes are formed, and
the second ground layer has a plate shape, and
in the transmission part, each of the first ground layer, the fourth ground layer, and the sixth ground layer has a shape in which a plurality of net-shaped meshes are formed, and
the second ground layer has a plate shape.

20. The flexible circuit board of claim 19, wherein, in the substrate part:
the first auxiliary shielding part comprises a fourth dielectric layer and a seventh ground layer laminated on one surface of the fourth dielectric layer and having a plate shape, and
the second auxiliary shielding part comprises a fifth dielectric layer and an eighth ground layer which is laminated on one surface of the fifth dielectric layer and in which a plurality of net-shaped meshes are formed, and
wherein, in the transmission part:
the first auxiliary shielding part comprises the fourth dielectric layer, and
the second auxiliary shielding part comprises the fifth dielectric layer and the eighth ground layer which is laminated on one surface of the fifth dielectric layer and in which a plurality of net-shaped meshes are formed.

* * * * *